United States Patent [19]

Kojima et al.

[11] Patent Number: 4,798,743
[45] Date of Patent: Jan. 17, 1989

[54] VAPOR DEPOSITION METHOD FOR THE GAAS THIN FILM

[75] Inventors: Seiji Kojima, Tokyo; Masakiyo Ikeda, Yokohama; Hiroshi Kikuchi, Tokyo; Yuzo Kashiwayanagi, Yokosuka, all of Japan

[73] Assignee: The Furukawa Electric Co., Ltd., Tokyo, Japan

[21] Appl. No.: 863,187

[22] Filed: May 14, 1986

[30] Foreign Application Priority Data

May 16, 1985 [JP] Japan .................. 60-104626

[51] Int. Cl.$^4$ .................................. C23C 16/30
[52] U.S. Cl. ........................ 427/255; 427/255.2; 437/107
[58] Field of Search ............... 427/87, 255, 255.2, 427/314

[56] References Cited

U.S. PATENT DOCUMENTS

| 4,142,924 | 3/1979 | Hsieh ........................ 427/87 |
| 4,168,998 | 9/1979 | Hasegawa et al. ........... 427/87 |
| 4,188,244 | 2/1980 | Itoh et al. .................. 427/87 |
| 4,507,169 | 3/1985 | Nogami ...................... 427/87 |
| 4,550,031 | 10/1985 | Abrokwah .................. 427/87 |
| 4,561,916 | 12/1985 | Akiyama et al. ........... 427/87 |

OTHER PUBLICATIONS

Wang et al., "Single and Polycrystalline GaAs Solar Cells Using OM.CVD", Chemical Vapor Deposition, pp. 249–260, TS 695 157, 1979.
Inst. Phys. Conf. Ser. No. 33b, 1977, Chapter 1, Bass et al., Controlled Doping of Gallium Arsenide Produced by Vapor Epitaxy.
Journal of Crystal Growth 55 (1981), pp. 164–172, Samuelson et al., Electrical and Optical Properties of Deep Levels in MOVPE Grown.
Inst. Phys. Conf. Ser. No. 63, Chapter 2, Glew, A Comparison of H$_2$S and H$_2$Se n-type Doping of GaAs by MOCVD.
J. Appl. Phys. 52(4), Apr. 1981, Mori et al., AlGaAs Grown by Metalorganic Chemical Vapor Deposition for Visible Laser.
Journal de Physique, Dec. 1982, p. C5-119, Hersee et al., The OMVPE Growth of GaAs and GaAlAs on a Large Scale.
J. Electrochem. Soc., Mar. 1985, pp. 662–668, Tandon et al., Large-Scale Growth of GaAs Expitaxial Layers by Metal Organic Chemical Vapor Deposition.

*Primary Examiner*—Sadie Childs
*Attorney, Agent, or Firm*—Oblon, Fisher, Spivak, McClelland & Maier

[57] ABSTRACT

A vapor phase deposition method for the GaAs thin film is disclosed, which is characterized in that, in the metal organic chemical vapor deposition method (MOCVD method) wherein arsine gas and organic gallium gas are decomposed thermally and GaAs crystals are allowed to deposit onto the GaAs substrate, for the deposition of n-type conductive GaAs crystals, arsine gas and organic gallium gas are supplied at such a supplying ratio (V/III) as p-type conductive GaAs crystals are deposited unless an impurity is added intentionally and gas of the compounds of VI group elements is added to these gases to make n-type conductive GaAs crystals having a carrier density of not less than $1 \times 10^{16}$ cm$^{-3}$.

4 Claims, 7 Drawing Sheets

VAPOR DEPOSITION METHOD FOR THE GAAS THIN FILM

BACKGROUND OF THE INVENTION

The present invention relates to a vapor deposition method for the GaAs thin film by which it has been made possible particularly to manufacture the wafer with a small dispersion in the distribution of the carrier density of the thin film of deposited n-type conductive crystals.

In general, for the vapor phase deposition for the GaAs thin film, a vapor deposition apparatus shown in FIG. 6 is used, wherein a high-frequency induction heating coil (5) is provided around the outer circumference of a reactor (1) with an introductory port (2) of source gases at the upper end and an exhaust port (3) of gases at the lower end through a cooling jacket (4) and a carbon susceptor (6) in the shape of truncated hexagonal pyramid is arranged in the reactor (1). With this apparatus, GaAs substrates (7) are fitted onto the pyramid faces of the susceptor (6) and, allowing the susceptor (6) to rotate in the direction of arrow mark, source gases are introduced into the reactor (1) from the introductory port (2) and allowed to eject from the exhaust port (3) at the lower end. In this way, the substrates (7) are heated to a predetermined temperature by the heating coil (5) and, through the thermal decomposition of source gases near the surface of the substrates (7), the crystals of GaAs are allowed to deposit onto the substrates (7).

As the source gases, organic gallium gas, for example, trimethyl gallium ($Ga(CH_3)_3$) and arsine gas ($AsH_3$) are used. In general MOCVD method (Metal Organic Chemical Vapor Deposition), the type of conduction and the carrier density of deposited crystals when the addition of impurity is not made intentionally depend on the supplying ratio (V/III) of $Ga(CH_3)_3$ (III) and $AsH_3$ (V) as shown in FIG. 7. In the growth at atmospheric pressure of the reactor, if V/III is smaller than 10 to 20, p-type conductive crystals are produced, if it is larger than 10 to 20, n-type conductive crystals are produced and, if it is between 10 and 20, high resistive crystals with the lowest carrier density are produced (solid line). In the growth of reduced pressure (for example at 100 Torr), the value of V/III where p-type conductive crystals change to n-conductive crystals is larger than atmospheric pressure and between 20 and 50 (dashed line). Moreover, through the addition of gas having an impurity possible to become the source for the formation of electrons as an ingredient element to both source gases, the impurity is added to the depositing GaAs crystals to produce n-type conductive crystal film. As the impurity, sulfur is used most frequently and, as the gas containing this, hydrogen sulfide gas ($H_2S$) is used. By varying the flow rate of this gas, the concentration of electrons, that is, the carrier density of n-type crystals is controlled.

In this way, for the deposition of, for example, epitaxial wafer used for FET, high resistive crystal film (hereinafter abbreviated as buffer layer) having a thickness of 2 to 3 μm is allowed to deposit onto the GaAs substrate and n-type conductive crystal film (hereinafter abbreviated as doped layer) having a thickness of about 0.5 μm is allowed to deposit thereon. Using non-doped crystals added no impurity intentionally for the buffer layer making the supplying ratio (V/III) of source gases 10 to 20 at atmospheric pressure and 20 to 50 at reduced pressure (for example at 100 Torr) so as to make the resistance highest among the crystals by general MOCVD method and heating the substrates at 600° to 700° C., the buffer layer is deposited and, in succession, by adding hydrogen sulfide gas to source gases, the doping layer is deposited.

Although the carrier density of the depositing doped layer can be controlled by the flow rate of $H_2S$, it depends also on other deposition conditions. Namely, the carrier density varys also with the supplying ratio (V/III) of $AsH_3$ and $Ga(CH_3)_3$ and further with the flow rate of $Ga(CH_3)_3$ or the temperature of susceptor. As a result, in the crystal deposition of the wafer with a large area, there has been a problem that the dispersion is caused in the distribution of the carrier density of the doped layer of wafer due to the temperature distribution of susceptor, the difference in the decomposition ratio of $AsH_3$ resulting from the location on susceptor, or the like. For example, by conventional method before mentioned, the dispersion of the carrier density in a wafer were 6 to 7%.

SUMMARY OF THE INVENTION

As a result of various investigations in view of the situation, a vapor phase deposition method of wafer has been developed, wherein the dispersion in the distribution of the carrier density of the doped layer in a wafer is small (3–5%) even in the treatment of wafer with a large area by means of the vapor phase deposition. Namely, the invention is characterized in that, in the method wherein arsine gas and organic gallium gas are allowed to thermally decomposed at atmospheric or reduced pressure by heating the substrate for 600° to 700° C. and further sulfur—containing gas is added to both gases as the impurity to allow the doped layer to deposit, arsine gas and organic gallium gas are supplied at such a supplying ratio (V/III) as p-type conductive crystals are deposited, and sulfur-containing gas is added to these gases as the impurity to make up the doped layer having a carrier density of not less than $1 \times 10^{16} \, cm^{-3}$.

BRIEF DESCRIPTION OF THE DRAWING

In FIG. 6, 1 is a reactor, 2 is an introductory port of source gases, 3 is an exhaust port, 4 is a cooling jacket, 5 is a high-frequency induction heating coil, 6 is a susceptor, and 7s are GaAs substrates.

DETAILED DESCRIPTION OF THE INVENTION

Figure 6:
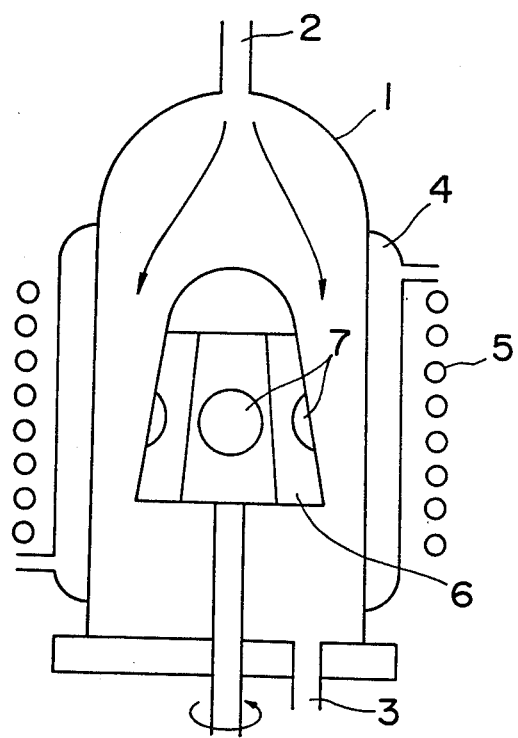
FIG. 6 is an illustration diagram showing one example of the vapor phase deposition apparatus.
Figure 7:
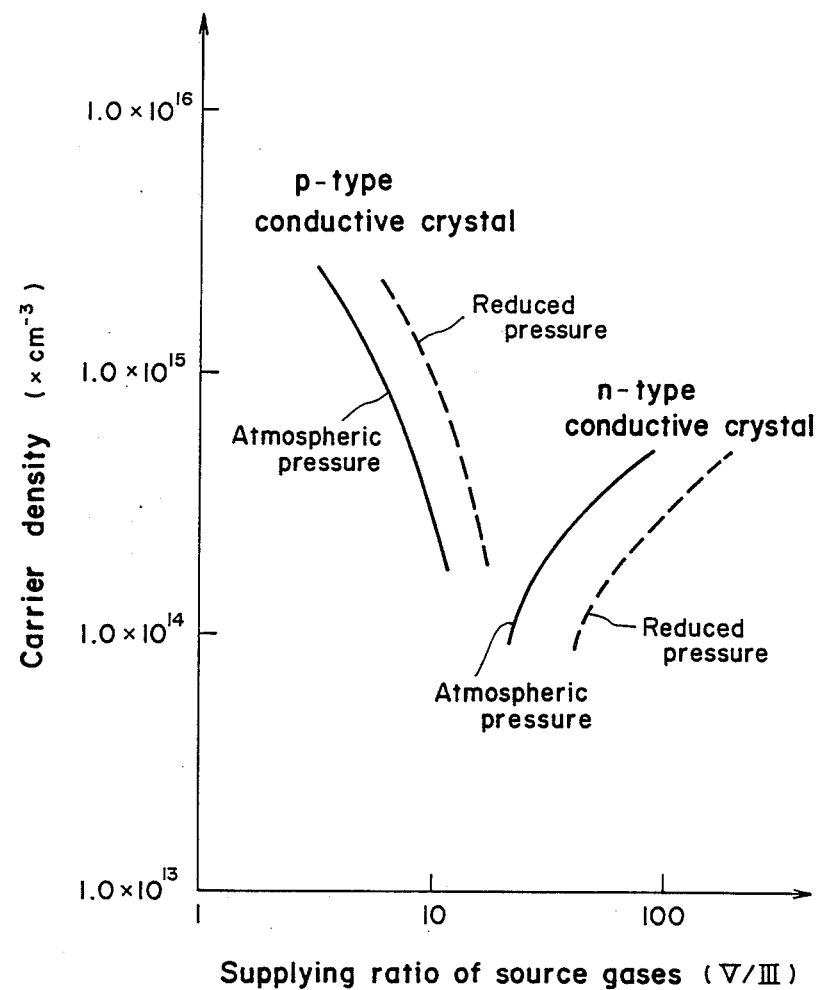
FIG. 7 is an illustration diagram showing the relationship between the supplying ratio (V/III) of source gases when sulfur-containing gas is not added as the impurity and the type of conduction and the carrier density (solid line and dashed line indicate the case in the growth at atmospheric pressure and reduced pressure (100 Torr), respectively).

According to the invention, organic gallium gas and arsine gas are allowed to be decomposed thermally at substrate temperature of 600° to 800° C. by the use of the vapor phase deposition apparatus, for example, the apparatus shown in FIG. 6, and further, adding gas having VI group element as an ingredient element, the doped layer is allowed to deposit onto the GaAs substrate, thereby arsine gas and organic gallium gas are supplied at such a supplying ratio (V/III) as p-type conductive crystals are deposited unless the impurity is added intentionally.

By supplying arsine gas and organic gallium gas at such a supplying ratio (V/III) as p-type conductive crystals are deposited unless an impurity is added intentionally and by adding sulfur-containing gas to these gases as the impurity for the deposition of doped layer, the dispersion in the distribution of the carrier density of doped layer can be decreased remarkably (3 to 5%). The reason is not clear, but it is considered due to the fact that, since the quantity of arsine gas becomes little in source gases at such a supplying ratio (V/III) as p-type conductive crystals are deposited, sulfur is apt to be taken in efficiently from sulfur-containing gas. Also if substrates are kept at the temperature of 700° to 800° C. with such a supplying ratio above mentioned, the dispersion can be decreased remarkably.

EXAMPLES (1) Employing the apparatus shown in FIG. 6 and using $AsH_3$ and $Ga(CH_3)_3$ for source gases, the buffer layer was allowed to deposit at atmospheric pressure in a thickness of about 3 $\mu$m onto the GaAs substrate having a diameter of 2 inches. Thereafter, making the supplying ratios (V/III) of source gases 6.25 (the condition of this invention), 10 and 20 (the condition of conventional method) and adding $H_2S$ to these gases as sulfur-containing gas, the doped layer having a thickness of about 0.5 $\mu$m was allowed to deposit at atmospheric pressure to manufacture the epitaxial wafer for FET.

The molar fraction of $Ga(CH_3)_3$ was $1.23 \times 10^{-4}$, that of $H_2S$ was $1.83 \times 10^{-6}$, and the temperature of the substrate was made 650, 710 and 750, respectively.

Of the wafer with a diameter of 2 inches thus manufactured, the carrier density and the dispersion in the carrier density were measured within a diameter of 40 mm on the doping layer. The results thereof are shown in FIG. 1 and FIG. 2.

Figure 1:
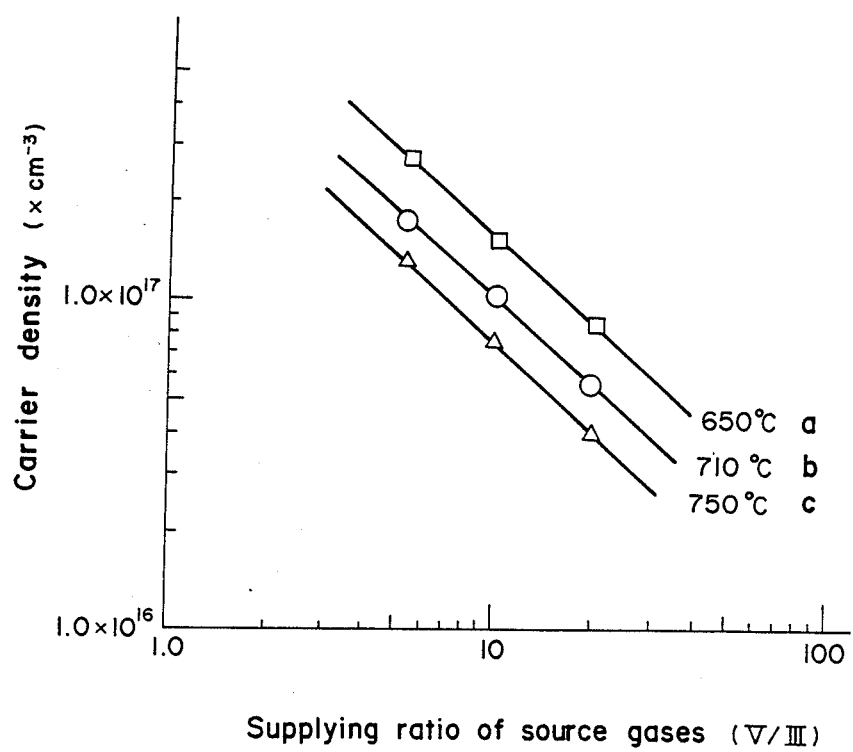
FIG. 1 is an illustration diagram showing the effect of the supplying ratio (V/III) of source gases on the carrier density of the doped layer in the growth at atmospheric pressure (a, b and c indicate the case of the substrate temperature of 650°, 710° and 750° C., respectively).
Figure 2:
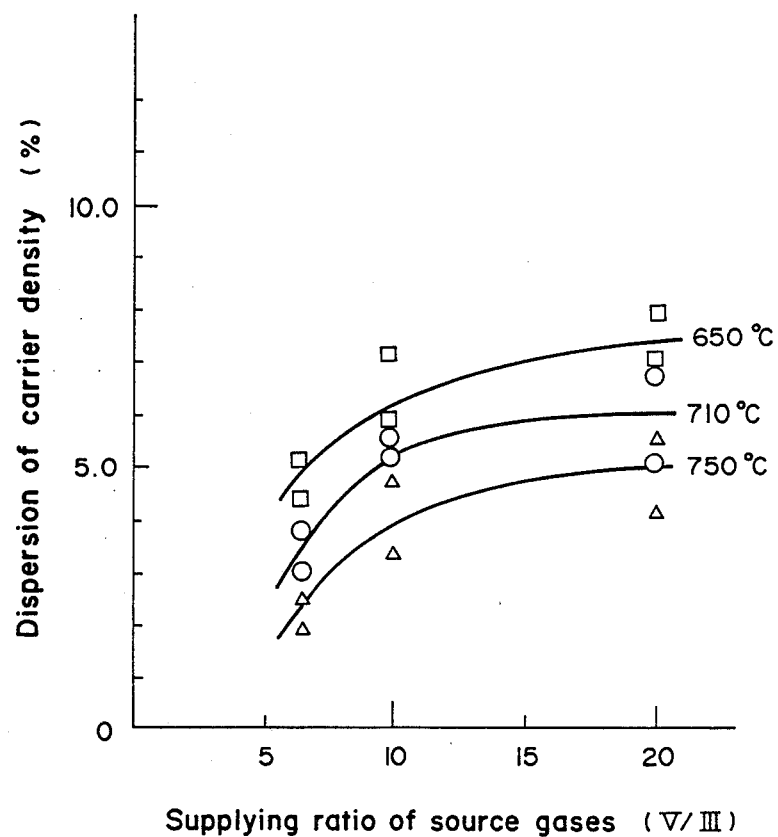
FIG. 2 is an illustration diagram showing the relationship between the dispersion in the distribution of the carrier density of the doped layer and the supplying ratio (V/III) of source gases in the growth at atmospheric pressure (a, b and c indicate the case of the substrate temperature of 650°, 710°, 750° C., respectively).

FIG. 1 shows the relationship between the carrier density and the supplying ratio (V/III) of source gases. As evident from the diagram, it can be seen that, at any substrate temperature as the supplying ratio (V/III) of source gases becomes small, the carrier density of the doped layer becomes large because of sulfur being apt to be taken in efficiently. Moreover, FIG. 2 shows the relationship between the dispersion in the carrier density and the supplying ratio (V/III) of source gases. As seen from the diagram evidently, the dispersions in the carrier density of the doped layer at substrate temperature of 650° C. are about 4.8%, 6.0% and 7.3%, at 710° C. about 3.7%, 5.6% and 6.7% and at 750° C. about 2.4%, 3.8% and 4.8% when the supplying ratios (V/III) of source gases are 6.25, 10 and 20, respectively, and, by making the supplying ratio (V/III) of source gases small, the dispersion in the carrier density of the doped layer becomes small. Also, evident from the result as shown in FIG. 2, smaller dispersion is effected at higher substrate temperature of 700° to 800° C.

Figure 3:
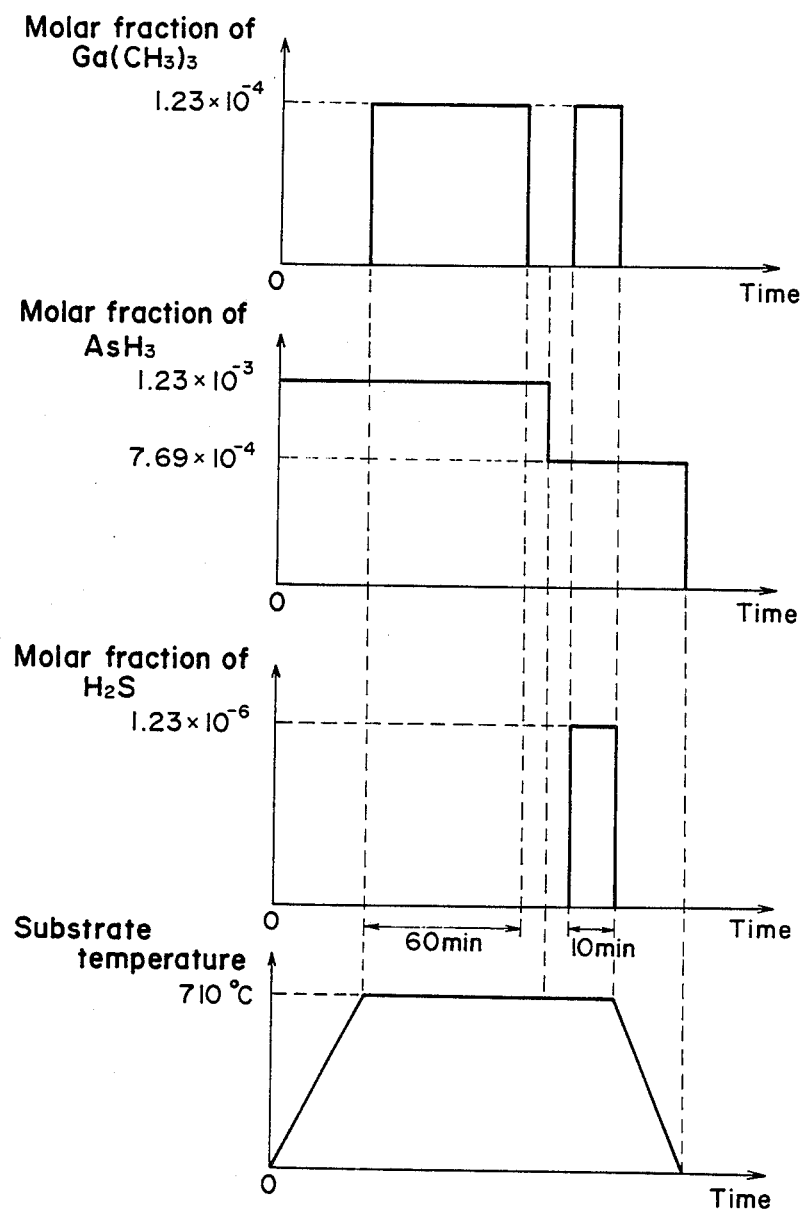
FIG. 3 is an illustration diagram showing one example of the growth sequence in the vapor phase deposition method of the invention at atmospheric pressure.

Besides, in the manufacture of epitaxial wafer for FET as described above, an example of the growth sequence is shown in FIG. 3, by which the buffer layer is allowed to deposit making the supplying ratio (V/III) of source gases 10 and the doping layer is allowed to deposit thereon making the supplying ratio (V/III) of source gases 6.25. Namely, $AsH_3$ is supplied at a rate of molar fraction of $1.23 \times 10^{-3}$ and the substrate is heated. When the temperature of the substrate reached to decided temperature (600° to 800° C.), $Ga(CH_3)_3$ is supplied at a rate of molar fraction of $1.23 \times 10^{-4}$ and, making the supplying ratio (V/III) of source gases 10, the buffer layer is allowed to deposit for 60 minutes. Then, after the supplying amount of $AsH_3$ decreased to a rate of molar fraction of $7.69 \times 10^{-4}$ by stopping the introduction of $Ga(CH_3)_3$, $Ga(CH_3)_3$ is supplied again at a rate of molar fraction of $1.23 \times 10^{-4}$ to make the supplying ratio (V/III) of source gases 6.25 and, at the same time, $H_2S$ is supplied at a rate of molar fraction of $1.23 \times 10^{-6}$ to allow the doped layer to deposit for 10 minutes.

Figure 4:
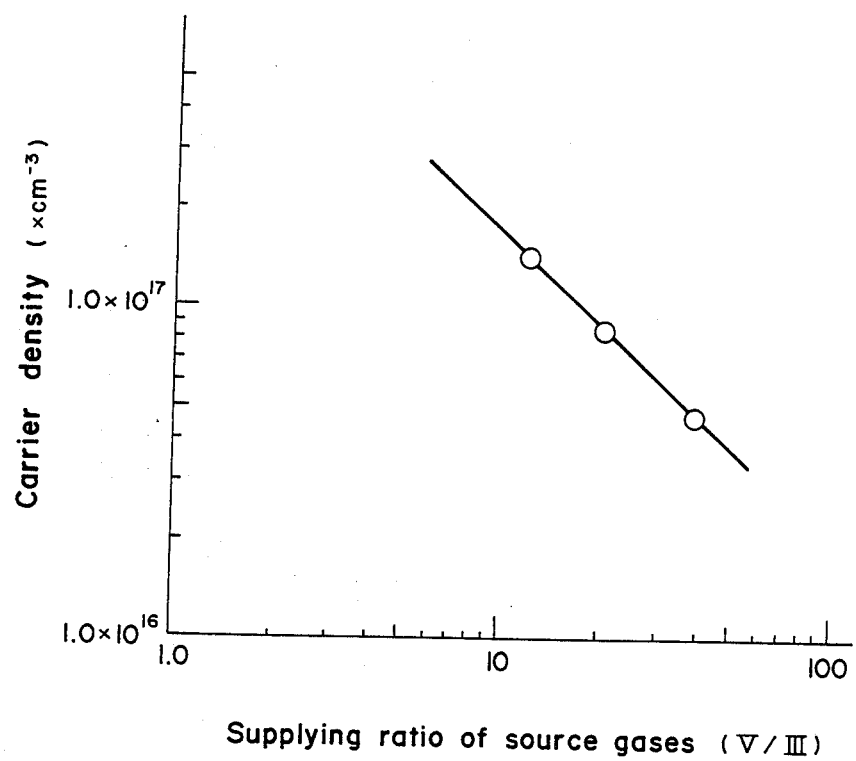
FIG. 4 is an illustration diagram showing the effect of the supplying ratio (V/III) of the source gases on the carrier density of the doped layer in the growth at reduced pressure (100 Torr) and at substrate temperature of 710° C.

(2) Employing the apparatus shown in FIG. 4 and using $AsH_3$ and $Ga(CH_3)_3$ for source gases, the buffer layer was allowed to deposit at reduced pressure, for example at 100 Torr in a thickness of about 3 $\mu$m onto the GaAs substrate having a diameter of 2 inches. Thereafter, making the supplying ratios (V/III) of source gases, 12.5 (the condition of this invention), 20 and 40 (the condition of conventional method) and adding $H_2S$ to these gases as sulfur-containing gas, the doped layer having a thickness of about 0.5 $\mu$m was allowed to deposit at reduced pressure (100 Torr) to manufacture the epitaxial wafer for FET.

The molar fraction of $Ga(CH_3)_3$ was $1.23 \times 10^{-4}$, that of $H_2S$ was $1.83 \times 10^{-6}$, and the temperature of the substrate was made 710° C.

Figure 5:
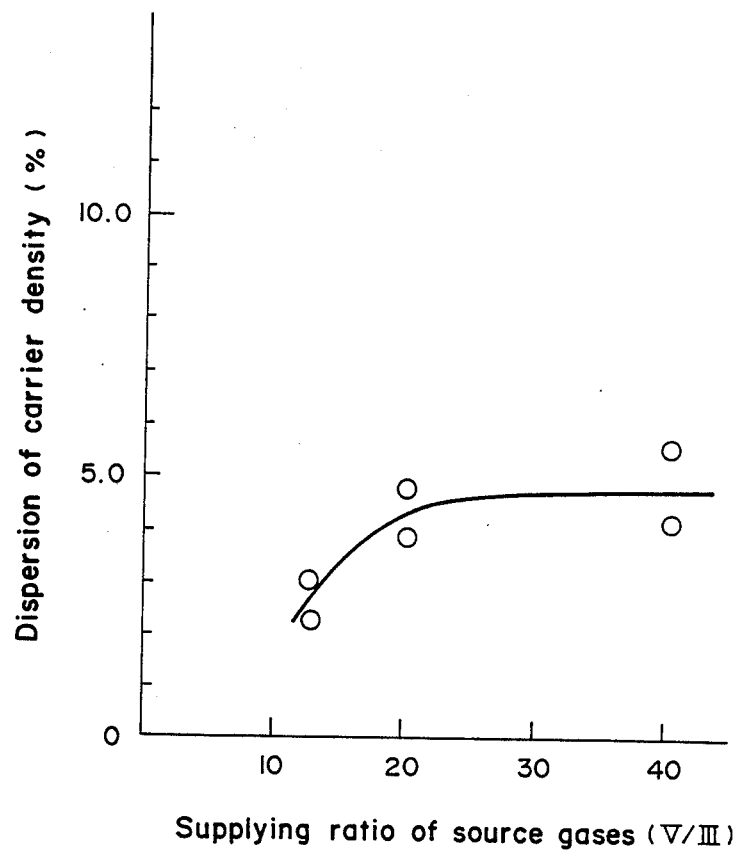
FIG. 5 is an illustration diagram showing the relationship between the despersion in the distribution of the carrier density of the doped layer and the supplying ratio (V/III) of source gases in the growth of reduced pressure (100 Torr) and at the substrate temperature of 710° C.

Of the wafer with a diameter of 2 inches thus manufactured, the carrier density and the dispersion in the carrier density were measured within a diameter of 40 mm on the doped layer. The results thereof are shown in FIG. 4 and FIG. 5.

FIG. 4 shows the relationship between the carrier density and the supplying ratio (V/III) of source gases. As evident from the diagram, it can be seen that, as the supplying ratio (V/III) of source gases becomes small, the carrier density of the doped layer becomes large because of sulfur being apt to be taken in efficiently. Moreover, FIG. 5 shows the relationship between the dispersion in the carrier density and the supplying ratio (V/III) of source gases. As seen from the diagram evidently, the dispersions in the carrier density of the doped layer are about 2.7%, 4.5% and 5.0% when the supplying ratios (V/III) of source gases are 12.5, 20 and 40, respectively, and, by making the supplying ratio (V/III) of source gases small, the dispersion in the carrier density of the doped layer becomes small.

Besides, in the manufacture of epitaxial wafer for FET in the growth at reduced pressure as described above, for example, the buffer layer is allowed to deposit making the supplying ratio (V/III) of source gases 30 and the doping layer is allowed to deposit thereon making the supplying ratio (V/III) of source gases 12.5. Namely, $AsH_3$ is supplied at a rate of molar fraction of $3.69 \times 10^{-3}$ and the substrate is heated. When the temperature of the substrate reached to decided temperature (600° to 800° C.), $Ga(CH_3)_3$ is supplied at a rate of molar fraction of $1.23 \times 10^{-4}$ and, making the supplying ratio (V/III) of source gases 30, the buffer layer is allowed to deposit for 60 minutes. Then, after the supplying amount of $AsH_3$ decreased to a rate of molar fraction of $1.54 \times 10^{-3}$ by stopping the introduction of $Ga(CH_3)_3$, $Ga(CH_3)_3$ is supplied again at a rate of molar fraction of $1.23 \times 10^{-4}$ to make the supplying ratio (V/III) of source gases 12.5 and, at the same time, $H_2S$ is supplied at a rate of molar fraction of $1.23 \times 10^{-6}$ to allow the doped layer to deposit for 10 minutes.

The invention exerts a remarkable effect in that, in the vapor deposition allowing the doped layer to deposit onto the GaAs substrate at substrate temperature of 600° to 800° C., by supplying the source gases at such a supplying ratio (V/III) of source gases as p-type conductive crystals are deposited and adding sulfur-containing gas to these gases, the dispersion in the distribution of the carrier density of the doped layer decreases within a diameter of 40 mm on the doped layer of wafer with a diameter of 2 inches, and more elements for electronic devices, the dispersion in the distribution of the carrier density thereof being within 5%, can be made out from the wafer with a diameter of 2 inches.

What is claimed is:

1. A metal organic chemical vapor deposition method for the production of an n-type GaAs thin film, comprising the steps of
   (i) supplying arsenic hydride gas and organic gallium gas to a heated substrate, wherein the supplying ratio of said gases is sufficient to produce a p-type conductive GaAs crystal, and
   (ii) adding a gas comprising a compound of a group VI element to said arsenic hydride and said organic gallium gas to produce said n-type film, whereby said group VI element becomes a dopant in said n-type GaAs thin film, and
   wherein said thin film has a carrier density of not less than $1 \times 10^{16} cm^{-3}$.

2. The vapor deposition method for the GaAs thin film according to claim 1, wherein organic gallium gas is trimethyl gallium.

3. The vapor deposition method for the GaAs thin film according to claim 1 or claim 2, wherein gas of the compounds of VI group elements is hydrogen sulfide.

4. The vapor deposition method for GaAs thin film according to claim 1, wherein the heated substrate of GaAs is heated at a temperature between 600° C. and 800° C.

* * * * *